United States Patent

Thompson

[15] 3,649,929

[45] Mar. 14, 1972

[54] SINUSOIDAL AND SQUARE WAVE OSCILLATOR WITH AUTOMATIC GAIN CONTROL

[72] Inventor: James E. Thompson, Scottsdale, Ariz.

[73] Assignee: Motorola, Inc., Franklin Park, Ill.

[22] Filed: Nov. 30, 1970

[21] Appl. No.: 93,543

[52] U.S. Cl. ..................................331/61, 307/261, 331/75, 331/108 D, 331/109, 331/117 R, 331/183

[51] Int. Cl. ..........................................H03b 3/02, H03b 5/12

[58] Field of Search ....................331/75, 108 C, 108 D, 109, 331/117 R, 183, 61; 307/261

[56] References Cited

UNITED STATES PATENTS

| | | | |
|---|---|---|---|
| 3,054,967 | 9/1962 | Gindi | 331/75 |
| 3,378,791 | 4/1968 | Towner | 331/109 X |

*Primary Examiner*—Roy Lake
*Assistant Examiner*—Siegfried H. Grimm
*Attorney*—Mueller and Aichele

[57] ABSTRACT

There is disclosed an integrated circuit which functions as a sinusoidal and square wave generator with a direct coupled automatic gain control to vary the current through the oscillator, so as to keep the gain of the oscillator at a figure less than that at which the nonlinearity of the circuit becomes significant. The automatic gain control portion of the circuit includes half-wave rectifying and peak following circuits which follow the peak to peak voltage in the oscillator section and control the current through the oscillator as a function of this voltage. The square wave generating circuit includes a half-wave rectifying circuit and a high gain amplifying section to provide a partially clipped square wave operating below a reference potential, making the square wave signal compatible with emitter coupled logic systems.

13 Claims, 2 Drawing Figures

INVENTOR.
James E. Thompson
BY
Mueller & Aichele
ATTY'S

SINUSOIDAL AND SQUARE WAVE OSCILLATOR WITH AUTOMATIC GAIN CONTROL

BACKGROUND

This invention relates to integrated circuits and more particularly to an integrated circuit oscillator with a direct coupled automatic gain control, having both sinusoidal and square wave outputs.

In the past there have been discrete circuits in which an oscillator has utilized an automatic gain control circuit to maintain the amplitude of its output constant. These circuits are, however, capacitance coupled making integrated circuit fabrication difficult because of the circuit area necessary for capacitance coupled circuits. The outputs of these oscillators are sinusoidal and no provision is made to provide both square wave and sine wave outputs.

In high frequency oscillators used in clocking circuits, high spectral purity of the oscillator output signal must be maintained commensurate with the current high speed switching and logic circuits. State of the art oscillators suffer from non-linearities introduced when the gain of the oscillator exceeds unity to such an extent that non-linear characteristics of the circuit degrade the purity of the output signal.

The problem of eliminating non-linearities is solved in the subject invention by limiting the gain of the oscillator to a gain of 1. Any non-linearities occurring in the circuit are thus not amplified and are of such a low level that they are not deleterious. The integrated circuit oscillator disclosed herein maintains spectral purity by controlling oscillator gain with a direct coupled automatic gain control. The automatic gain control includes half-wave rectifying and peak following circuits which serve to control the current drawn by the oscillator as a function of the peak to peak voltage in the oscillator loop and thus limits the gain of the oscillator by reducing the current through the oscillator when the peak to peak voltage exceeds a given value. A high quality square wave output operating just below a reference potential is also available from the circuit which is compatible with emitter coupled logic (ECL) circuits. Additionally, the amplitude of both the sinusoidal and square wave outputs of this oscillator are maintained at a constant output level by the automatic gain control circuit. In the subject integrated circuit the level translating transistor of the automatic gain control circuit is shared with the square wave generating circuit to insure that the square wave signal is generated a controlled distance below the aforementioned reference potential.

BRIEF DESCRIPTION OF THE INVENTION

There is disclosed an integrated circuit which functions as a sinusoidal and square wave generator with a direct coupled automatic gain control to vary the current through the oscillator, so as to keep the gain of the oscillator at a figure less than that at which the non-linearity of the circuit becomes significant. The automatic gain control portion of the circuit includes half-wave rectifying and peak following circuits which follow the peak-to-peak voltage in the oscillator section and control the current through the oscillator as a function of this voltage. The square wave generating circuit includes a half-wave rectifying circuit and a high gain amplifying section to provide a partially clipped square wave operating below a reference potential, making the square wave signal compatible with emitter coupled logic systems.

SUMMARY OF THE INVENTION

It is therefore an object of this invention to provide an improved integrated circuit oscillator whose outputs are regulated by an automatic gain control circuit integral with the oscillator circuit.

It is another object of this invention to provide an integrated circuit oscillator having an automatic gain control in which a portion of the automatic gain control serves as a portion of a circuit designed to generate a square wave pulse train.

It is a further object of this invention to provide an oscillator having both square wave and sinusoidal outputs in which the spectral properties of the output signals are uniform and of high quality.

It is another object of this invention to provide an integrated circuit oscillator having an automatic gain control utilizing half-wave rectifying and peak following circuits which provide an output corresponding to the integrated value of the positive portion of the peak to peak voltage in the oscillator loop to control the current through the oscillator and thus its gain.

BRIEF DESCRIPTION OF THE DRAWINGS

Other objects of this invention will be better understood upon reading the description of the following drawings.

DETAILED DESCRIPTION OF THE INVENTION

Figures 1, 2:
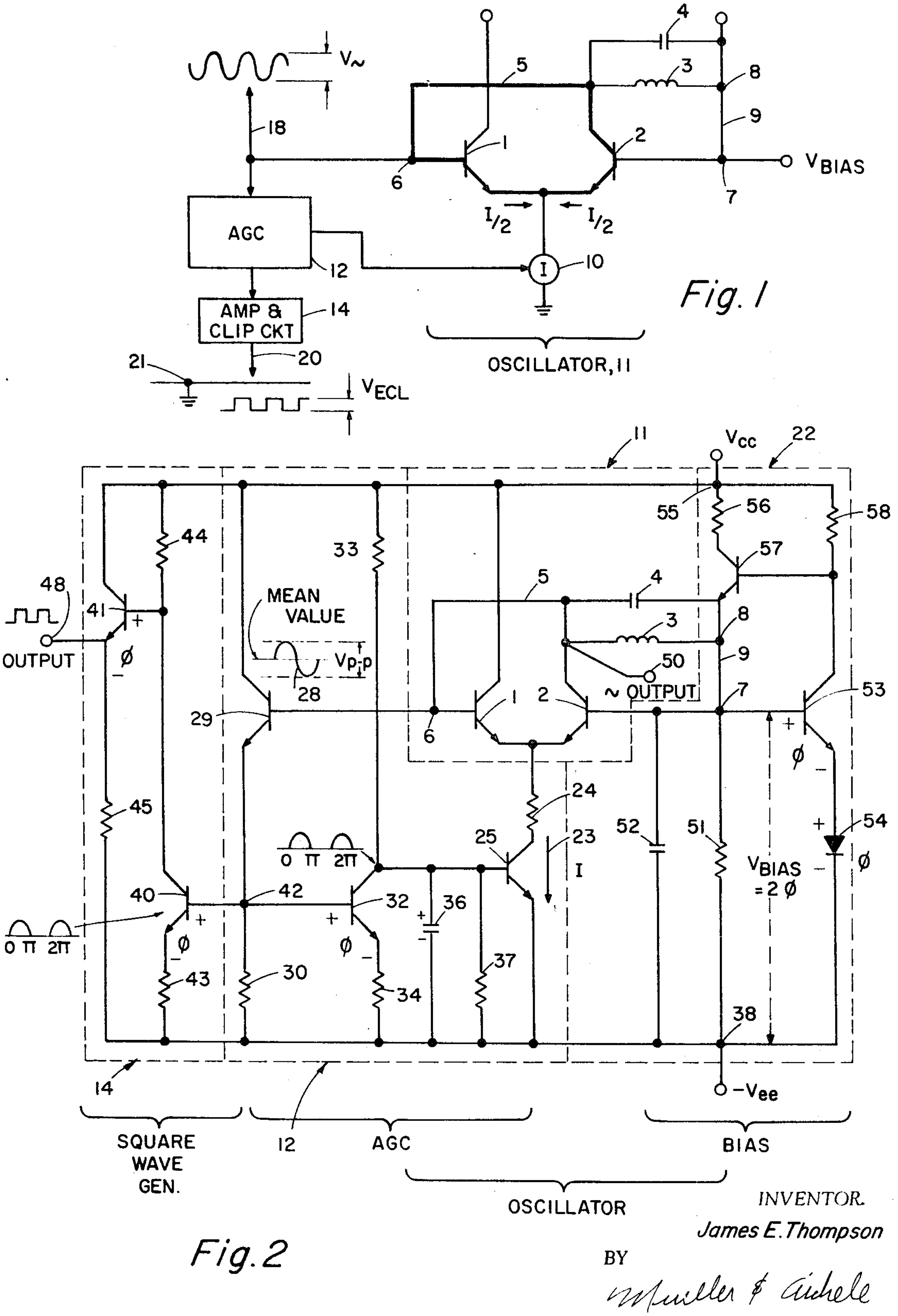
FIG. 1 is a schematic and block diagram of a typical oscillator circuit in which an automatic gain control circuit is used both to control the gain of the oscillator circuit and to provide a level compensated input to a square wave generating circuit.
FIG. 2 is a schematic diagram of an integrated circuit oscillator with automatic gain control and both sinusoidal and square wave outputs.

The subject oscillator circuit shown diagrammatically in FIG. 1 provides sinusoidal and square wave outputs of high spectral purity because the gain of the oscillator is limited to a level below which non-linearities in the circuit would substantially cause degradation of the output signals. "Degradation" as referred to herein refers to those non-linearities of the circuit which become significant when the output of the oscillator reaches an amplitude at which the effects of the non-linear circuit conditions are amplified significantly. By controlling the gain of the oscillator, not only are the non-linear effects removed from the output signal, but the output signal is also limited in amplitude to a constant value.

In FIG. 1 a simple oscillator circuit is shown composed of transistors 1 and 2 in an emitter coupled configuration. The collector of transistor 2 is coupled to a tank circuit composed of an inductor 3 and a capacitor 4. The oscillator loop is completed by connecting the base of transistor 1 to the collector transistor 2 as shown by heavy line 5. In order for the oscillator to operate in a balanced manner, the DC potential at point 6 must equal the bias on the base of transistor 2. This bias, shown at point 7, is coupled through inductor 3 to the base of transistor 1 by connecting the end of the inductor shown at point 8 to point 7 via circuit 9. The appropriate bias is delivered to transistor 1, since the coil is assumed to have zero resistance to a DC voltage. The current drawn through this circuit is represented by the letter I shown in circle 10. The current drawn through each of the transistors is shown by suitable arrows labelled I/2 which reflect the balanced condition of the oscillator.

The gain in this oscillator circuit is given by the expression $G=R_L9I_e/2kT$ in which $R_L$ is the impedance of the "tank" at resonance, $q$ is the electron charge in coulombs, $I_e$ is the current flowing through one of the transistors, $k$ is Boltzmann's constant, and $T$ refers to the temperature in degrees Kelvin In more general terms the loop gain $G$ is given by the expression $G=QX_L/2r_e$ where $r_e$ is a parameter of the transistor. Since $r_e=kT/qI_e$, the loop gain $G=QX_Lql/4kT$. Here $Q$ is the quality factor and $X_L$ is the reactance of the coil.

If the loop gain is greater than 1, then the amplitude increases until it is limited by the non-linearities of the subject circuit. These non-linearities cannot be specified with any degree of certainty. When the amplitude of the voltage in the circuit loop reaches a certain level, the non-linearities of the circuit begin to destroy the $Q$ of the circuit. In the gain equation $G=QX_LqI/4kT$ the non-linearities are reflected in the quality factor $Q$. Since the non-linearity cannot be specified a high $Q$ system is selected so that the loop gain can exceed 1. However in high $Q$ systems there is more clipping due to the forward biasing of the transistor collectors. The object of the subject circuit is to avoid clipping in a high $Q$ circuit by adjusting the loop gain to always equal 1. This is accomplished by controlling the current $I$ drawn by the oscillator circuit so that the amplitude of the signal in the loop is controlled to a value less than that at which the non-linearities become significant. This is accomplished by an automatic gain control circuit 12 which includes a peak following circuit to detect the peak to peak amplitude of the voltage at point 6. The peak voltage is subsequently used in a current control circuit of the automatic gain control.

Part of the automatic gain control circuit includes a level translating transistor which removes one-half the bias term appearing as a constant $2\phi$ DC component of the signal in the oscillator loop. The output of this transistor is shared by the peak following circuit and also by the square wave generating circuit. In the course of the operation of these two circuits the other half of the bias term is removed so that the output voltages of the peak following and square wave generating circuits will be at an appropriate level with respect to a reference potential. The square wave generating circuit is shown as an amplifying and clipping circuit 14. Both the automatic gain control circuit and the square wave generating circuit will be discussed in detail in connection with FIG. 2.

At this point it is appropriate to note that the sinusoidal output of the oscillator shown at 18 has a constant voltage $V_{\sim}$ and that the square wave output shown at 20 is also constant and at a voltage $V_{ECL}$. $V_{ECL}$ is delivered below a reference potential shown diagrammatically at 21 because of the level at which the input signal is delivered to circuit 14.

The automatic gain control and square wave generating circuits are now described with the oscillator circuit shown in FIG. 2. These circuits are enclosed in dotted boxes labelled 11, 12 and 14 to correspond to these elements as shown in FIG. 1. Also shown is a biasing circuit surrounded by dotted line 22. As mentioned hereinbefore, the amplitude of the signal travelling in the feedback loop 5 of oscillator 11 is controlled by the current drawn through this circuit. This current is shown by arrow 23 and is labelled I as in FIG. 1. As can be seen, the current is drawn through transistor 25 and is regulated by the voltage delivered to the base of this transistor which is a function of the peak to peak voltage in oscillator loop 5. The signal occurring in loop 5 is shown by sine wave 28 which has a peak to peak voltage, $V_{p-p}$, as shown. This signal is tapped from the loop at point 6 and is delivered to the base of transistor 29. The signal at the base of transistor 29 is $(V_{p-p}/2)\sin\phi+V_{bias}$. $V_{bias}$ will be shown to equal $2\phi$ where $\phi$ is both the voltage drop across diode 54 and the base to emitter drop of transistor 53 in the power supply. It will be appreciated that in order to obtain the mean value of sine wave 28, the $V_{bias}$ term which is equal to $2\phi$, must be eliminated. Transistor 29 serves as a level translator and drops $(V_{p-p}/2)\sin\phi+V_{bias}$ by an amount equal to $\phi$, thus eliminating a portion of the $V_{bias}$ term. This voltage will appear at point 42. Level translating transistor 29 also serves to prevent loading of the tank circuit by resistor 30 between point 42 and $-V_{ee}$. Resistor 30 is set to a value which insures that transistor 29 will always be in its conducting state. Since level translation transistor 29 drops the loop signal by an amount $\phi$, the signal at point 42 has a mean value above $-V_{ee}$ equal to $\phi$. The signal at point 42 is applied to transistor 32 having an emitter to base drop of $\phi$ which removes the other portion of the bias term and leaves the mean value at the emitter of transistor 32 equal to 0 volts. Transistor 32 is biased by resistors 33 and 34 to be conducting only with the positive swing of the signal at 42. Since the mean value of the signal in the oscillator loop has now been reduced to 0 volts it will be appreciated that the peak amplitude of these positive swings at the emitter of transistor 32 will be $V_{p-p}/2$. The current through transistor 32 is thus a half-wave rectified current having a peak value $V_{p-p}/2R_{34}$. The output of transistor 32 is tapped from its collector which is coupled to the base of current control transistor 25. Capacitor 36 and resistor 37 are coupled between the base of transistor 25 and $-V_{ee}$ to integrate this half-wave rectified voltage over time. If it is assumed that capacitor 36 is so large that it filters all AC components from the voltages at the base of transistor 25, then the base voltage at 25 will depend only on the current through resistor 33, resistor 37 and the average value of the current through transistor 32 ($I_{32}$). The average value of $I_{32}$ is shown in the following equations:

$$\bar{I}_{32}=\frac{1}{2\pi}\int_0^{2\pi} I_{32}\,d\theta$$

$$I_{32}(\text{between } 0 \text{ and } \pi)=(V_{p-p}/2R_{34})\sin\theta$$
$$I_{32}(\text{between } \pi \text{ and } 2\pi)=0$$

Thus $$\bar{I}_{32}=\frac{1}{2\pi}\int_0^{\pi}\frac{V_{p-p}}{2R_{34}}\sin\theta\,d\theta=\frac{V_{p-p}}{4\pi R_{34}}[-\cos\theta]|_0^{\pi}$$

$$\bar{I}_{32}=V_{p-p}/4\pi R_{34}[-\cos\pi+\cos 0]$$
$$\bar{I}_{32}=V_{p-p}/4\pi R_{34}\cdot 2=V_{p-p}/2\pi R_{34}$$

However $$I_{33}=\frac{V_{cc}+V_{ee}-\phi}{R_{33}}$$

where $V_{cc}$ is a reference potential applied at point 55. It will be appreciated that $I_{37}=\phi/R_{37}$.

At equilibrium the gain of the oscillator must equal 1. At a gain less than 1 oscillation cannot occur, and at a gain greater than 1 the amplitude of the signal in the oscillator loop would increase until non-linearities would occur. Equilibrium is established only at a particular peak to peak value and corresponds to $I_{33}=\bar{I}_{32}+I_{37}$. For the condition $I_{33}>\bar{I}_{32}+I_{37}$, transistor 25 would be in saturation and the gain of the oscillator circuit would increase corresponding to an increase in current through transistor 25. This current is shown by arrow 23. For the condition $I_{33}<\bar{I}_{32}+I_{37}$ transistor 29 would be rendered non-conducting and the gain in the oscillator circuit would decrease with a corresponding decrease in the current through transistor 25. For the equilibrium condition, however, $$\frac{V_{cc}+V_{ee}-\phi}{R_{33}}=\frac{V_{p-p}}{2\pi R_{34}}+\frac{\phi}{R_{37}}$$

where $V_{p-p}$ in this equation is the peak to peak voltage at equilibrium.

$$\frac{V_{p-p}}{2\pi R_{34}}=\frac{V_{cc}+V_{ee}-\phi}{R_{33}}-\frac{\phi}{R_{37}}.$$

Typically to establish ECL levels $R_{37}$ equals $R_{33}$. Thus $$\frac{V_{p-p}}{2\pi R_{34}}=\frac{V_{cc}+V_{ee}-2\phi}{R_{33}}.$$

$$V_{p-p}\ (\text{at equilibrium})=\frac{2\pi R_{34}}{R_{33}}(V_{cc}+V_{ee}-2\phi).$$

In a typical situation $V_{cc}=0$, or ground potential, $V_{ee}=5.2$ V., $\phi=0.7$ v., $R_{34}=62$ ohms and $R_{33}=3.6$ kohms. The peak to peak voltage at equilibrium is therefore approximately 400 millivolts. Since the peak to peak voltage at equilibrium contains a $\phi$ term there is some variation with temperature but this variation is held to about 0.2 millivolts per degree centigrade which is quite low. It should be noted that resistor 24 is included in the circuit for the sole purpose of limiting the current through transistor 25 to some maximum, but safe, value when the oscillator circuit is first turned ON or in the case that the tank circuit is accidentally shorted.

Thus it can be seen that as the peak to peak voltage at point 6 increases, the current through transistor 25 will decrease lowering the amplitude of the signal in the oscillator loop. Likewise, as the peak to peak value of the signal at point 6 decreases below the equilibrium value, current through transistor 25 will increase providing a gain of more than 1 for the oscillator circuit until the equilibrium value is established, at which point the gain of the oscillator circuit is limited to a gain of 1.

With respect to the square wave generating circuit, the signal available at point 42 has a mean value of $+\phi$ with respect to $-V_{ee}$. This signal is coupled to the base of transistor 40 which has a base to emitter drop of $\phi$ as shown thus dropping out the remainder of the $V_{bias}$ term in the oscillator loop signal. Transistor 40 is also biased into conduction only by positive swings of the signal at point 42 such that the peak voltage at the emitter of transistor 40 is also equal to $V_{p-p}/2$ with respect to $-V_{ee}$. During the negative half cycles of this signal, transistor 40 is OFF and the voltage, $V_{48(OFF)}$, at the output of transistor 41 equals $V_{cc}-\phi$ where the $\phi$ is equal to the emitter to base drop of transistor 41. When transistor 40 is at peak conduction $$V_{48(OFF)} V_{cc} - I_{40(PEAK)} \cdot R_{44} - \phi$$

where $I_{40(PEAK)}$ is the peak current through transistor 40 and is equal to $V_{p-p}/2R_{43}$. Thus $$V_{48(OFF)} 32\ V_{cc} - (V_{p-p}/2R_{43}) \cdot R_{44} - 100\ .$$

Typically as described hereinbefore $V_{p-p}$ is equal to 400 millivolts. For a typical circuit $R_{44}$ is equal to 120 ohms, $R_{43}$ is equal to 18 ohms, $V_{cc}$ is equal to 0 or ground potential and $\phi$ for both transistors 40 and 41 is equal to 0.7 v. Thus $V_{48(ON)}$ is approximately equal to −2 volts and $V_{48(OFF)}$ is approximately equal to −0.7 volts. It will be appreciated that the output at 48 is thus compatible with ECL levels and has an average value, integrating the half rectified sine wave, of approximately −1.3 volts which is the usual ECL threshold.

Some squaring is accomplished by square wave generating circuit 14 due to high stage gain which is approximately equal to $R_{44}/R_{43}$. It will be appreciated that there is still some rounding of the corners of the square wave but this is not a problem at the usual 150 megaHertz operating frequency of the oscillator.

The bias circuit which supplies bias voltage to the oscillator, automatic gain control, and square wave generating circuits is shown enclosed in dotted box 22. This circuit delivers $V_{bias}$ between points 7 and 38 equal to $2\phi$ where $\phi$, in this instance, is the base to emitter drop of transistor 53 and also the voltage drop across diode 54. It will be appreciated therefore that transistor 53 and diode 54 provide the $2\phi$ bias potential and act as a series regulator. Resistor 58 supplies current to transistor 53 and diode 54 and base current to transistor 57. Any current drawn by the oscillator from point 7 is supplied by transistor 57 so that there can be no loading of potential forced by transistor 53 and diode 54. Capacitor 52 is included to remove any AC component of the bias voltage and is connected between the base of transistor 2 and point 38. Current for the oscillator circuit is supplied through transistor 57. It will be appreciated that resistor 51 supplies current to operate transistor 57 and resistor 56 limits the current through 57 in the event that point 7 is accidentally shorted to $-V_{ee}$ by the user. Thus, both the current and the voltage supplied to the oscillator circuit are controlled and the circuit safeguarded against accidental shorting or grounding.

The integrated circuit described provides a self-regulated sinusoidal or square wave output having high spectral purity and constant voltage. The square wave output is available at a potential removed from a reference potential so that it is compatible with emitter coupled logic circuits. It will be appreciated that the automatic gain control feature and the square wave generating feature of this invention is provided by direct coupling.

What is claimed is:

1. An integrated circuit comprising:

biasing means for establishing a predetermined bias voltage;

a solid state oscillator including a circuit loop in which an oscillating electrical signal is established when the active elements of said oscillator are biased into conduction by the application of said bias voltage;

means responsive to the time averaged amplitude of positive excursions of said oscillating signal for controlling the current drawn by said oscillator such that the gain of said loop remains at unity; and means responsive to said oscillating signal for generating a clipped square wave signal, whereby the amplitudes of said oscillating and square wave signals are constant and said signals are of high spectral purity.

2. The circuit as recited in claim 1 wherein said square wave signal is generated at a level lower than a reference potential and wherein said oscillating signal is dropped in amplitude by an amount sufficient to enable generation of said square wave signal at said lower level.

3. The circuit as recited in claim 1 wherein said oscillating signal is coupled directly to said current controlling means and to said square wave generating means, and further including level translating means shared by both said current controlling and square wave generator means for removing a portion of the bias voltage normally occurring in said oscillating signal from the mean value of said oscillating signal thereby leaving a level translated signal.

4. The circuit as recited in claim 3 wherein both said current controlling and square wave generating means include half wave rectifying means to remove the remaining portion of said bias voltage from said oscillating signal and to provide a signal corresponding to only positive excursions of said oscillating signal.

5. The circuit as recited in claim 4 wherein said current controlling means also includes a peak following means to generate a signal corresponding to the integration of the positive excursions of said level translated signal over time, the signal produced by said integration being used to regulate the flow of current in said oscillator.

6. A system for removing biasing components in the signal generated by a solid state oscillator circuit which is biased into conduction by a predetermined bias voltage, and for using said signal with biasing components removed for controlling the gain of said oscillator circuit to a gain equal 1, comprising:

level translating means coupled to the output of said oscillator circuit for removing some of said biasing components while maintaining the waveform of said signal;

means for simultaneously removing the remaining biasing components and for transmitting only positive going portions of the signal generated by said oscillator circuit, thereby generating a half-wave rectified replica of the signal generated by said oscillator circuit in which constant DC biasing terms have been removed;

means for integrating said half-wave rectified replica over time so as to produce a second signal having an amplitude proportional to the peak to peak voltage of the signal generated by said oscillator circuit; and means for varying the gain of said oscillator circuit in response to the amplitude of said second signal such that the gain of said oscillator circuit is maintained at unity, whereby the gain of said oscillator circuit is controlled by only an AC portion of the signal generated by said oscillator circuit, all DC biasing components having been removed therefrom.

7. A system for varying the gain of an oscillator circuit such that the gain of said oscillator circuit is always equal to unity, comprising:

means for removing the DC components in the output signal generated by said oscillator circuit and for generating a half-wave rectified replica of said output signal having no DC components therein;

means for integrating said half-wave replica over time so as to generate a second signal; and means responsive to the amplitude of said second signal for controlling the current in said oscillator circuit such that the gain of said oscillator is maintained constant and equal to unity.

8. A system for generating a square wave pulse train below a reference potential, from the output of a sinusoidal waveform oscillator operating so as to produce a sinusoidal signal having a mean value at or above said reference potential comprising:

level translating means coupled to the output of said sinusoidal waveform oscillator for shifting the mean value of said sinusoidal output signal below said reference potential by a predetermined amount;

means for half-wave rectifying said shifted signal; and high gain means for amplifying said rectified signal so as to clip said rectified signal, thereby providing a square wave pulse train below said reference potential.

9. An integrated circuit including a pair of terminals across which bias voltage is supplied, and including a source of reference potential comprising:

an oscillator including a tank circuit and first and second transistors with the emitters thereof interconnected, the first of said transistors having a collector coupled to said reference potential and the base member of said first transistor and the collector of said second transistor being connected to one end of said tank circuit so as to form a circuit loop in which an oscillating electrical signal is established, the base of said second transistor being coupled to the other end of said tank circuit and to said one of said terminals such that the base of said first transistor is provided with said bias voltage through said tank circuit; and automatic gain control means for coupling the emitters of said first and second transistors to the other of said terminals such that the current drawn by said first and second transistors is altered to regulate the gain of said loop to equal unity in response to the amplitude of the signal in said loop, said automatic gain control means being directly coupled to said circuit loop and to said emitters.

10. The integrated circuit as in recited claim 9 wherein said automatic gain control means includes:

a third transistor having a collector connected to the emitters of said first and second transistors and an emitter coupled to said other terminal;

a fourth transistor having a collector coupled to said reference potential, a base coupled to the base of said first transistor, said fourth transistor being biased so that it is in its conducting mode such that said fourth transistor acts as a level translator because of its base to emitter voltage drop and removes a portion of the bias voltage contained in said oscillating electrical signal from the signal appearing at the emitter thereof;

a fifth transistor having its base connected to the emitter of said fourth transistor and its collector connected to the base of said third transistor such that another portion of said bias voltage is removed from said oscillating electrical signal because of the base to emitter voltage drop of said fifth transistor;

a first resistive element coupled at one end to the collector of said fifth transistor and at the other end thereof to said reference potential;

a second resistive element connected between the emitter of said fifth transistor and said other terminal, said first and second resistive elements biasing said fifth transistor into conduction during only excursions of the electrical signal delivered to the base thereof exceeding the voltage at said other terminal by an amount equal to the base to emitter voltage drop of said fifth transistor such that the signal at the collector of said fifth transistor is a half-wave rectified replica of said oscillating signal with no DC bias components; and a capacitative element and a third resistive element coupled in parallel between the base of said third transistor and said other terminal whereby the average voltage for said half-wave rectified replica is developed between the base of said third transistor and said other terminal such that the current through said third transistor is regulated by the peak to peak voltage in said circuit loop to limit the gain of said loop to unity, whereby the signal in said loop has a sinusoidal waveform having the frequency of said tank circuit and a constant amplitude.

11. The integrated circuit as recited in claim 10 wherein equilibrium and thus a loop gain of 1 is obtained whenever the current through said first resistive element is equal to the average current through said third transistor plus the current through said third resistive element.

12. The integrated circuit as recited in claim 11 and further including a half-wave rectifying and clipping circuit having its input directly coupled to the emitter of said fourth transistor, whereby the level translated output of said fourth transistor forms the input of said half-wave rectifying and clipping circuit and permits the production of a square wave signal below said reference potential at the output of said half-wave rectifying and clipping circuit.

13. The integrated circuit as recited in claim 12 wherein said half-wave rectifying and clipping circuit includes:

a sixth transistor having a base connected to the emitter of said fourth transistor;

a fourth resistive element coupled between the emitter of said sixth transistor and said other terminal and a fifth resistive element coupled between said reference potential and the collector of said sixth transistor, the ratio of the resistances of said fourth and fifth resistive elements providing said sixth transistor with a high gain and serving to bias said sixth transistor into conduction only during positive excursions of the electrical signal delivered to the base of said sixth transistor exceeding the base to emitter voltage drop of said sixth transistor;

a seventh transistor having a collector coupled to said reference potential and its base connected to the collector of said sixth transistor; and a sixth resistive element coupled between the emitter of said seventh transistor and said other terminal and having a resistance such that said seventh transistor is rendered highly conductive only when said sixth transistor is conducting, whereby a clipped square wave signal is available at the emitter of said seventh transistor at a level below said reference potential.

* * * * *